(12) United States Patent
Hu

(10) Patent No.: US 11,244,930 B2
(45) Date of Patent: Feb. 8, 2022

(54) ELECTRONIC DEVICE WITH LIGHT EMITTING UNITS WITH REDUCED POWER CONSUMPTION

(71) Applicant: InnoLux Corporation, Miao-Li County (TW)

(72) Inventor: Shun-Yuan Hu, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/508,311

(22) Filed: Jul. 11, 2019

(65) Prior Publication Data

US 2020/0051958 A1 Feb. 13, 2020

Related U.S. Application Data

(60) Provisional application No. 62/717,000, filed on Aug. 10, 2018.

(30) Foreign Application Priority Data

Jan. 17, 2019 (CN) .......................... 201910044000.4

(51) Int. Cl.
| | | |
|---|---|---|
| *H01L 25/07* | (2006.01) | |
| *H01L 25/075* | (2006.01) | |
| *H01L 27/12* | (2006.01) | |
| *H01L 27/02* | (2006.01) | |
| *H01L 33/50* | (2010.01) | |
| *H01L 33/56* | (2010.01) | |

(Continued)

(52) U.S. Cl.
CPC .... *H01L 25/0753* (2013.01); *G02F 1/133603* (2013.01); *H01L 27/0248* (2013.01); *H01L 27/1214* (2013.01); *H01L 33/44* (2013.01); *H01L 33/502* (2013.01); *H01L 33/56* (2013.01); *G02F 1/133612* (2021.01)

(58) Field of Classification Search
CPC .. G09G 3/32; G09G 3/3406; G09G 2320/064; G09G 2320/062; G09G 2300/0426; G09G 2330/021; H01L 25/13; H01L 25/167; H01L 27/0248; H01L 27/1214; H01L 27/13; H01L 27/156; H01L 27/3244; H01L 33/44; H01L 33/502; H01L 33/56
See application file for complete search history.

(56) References Cited

U.S. PATENT DOCUMENTS

2001/0045929 A1 11/2001 Prache
2002/0190935 A1 12/2002 Maeda
(Continued)

OTHER PUBLICATIONS

Yongjin Wang et al., Optimization of PECVD silicon oxynitride films for anti-reflection coating, VACUUM 72, 2003, pp. 345-349, XP055680504.

*Primary Examiner* — Liliana Cerullo
(74) *Attorney, Agent, or Firm* — Winston Hsu

(57) ABSTRACT

An electronic device including a driving circuit substrate and a plurality of light emitting units is provided. The driving circuit substrate includes a plurality of active elements, the light emitting units are disposed on the driving circuit substrate, each of the light emitting units is electrically connected to the corresponding active element, wherein one of the active elements provides a first current to the corresponding light emitting unit, such that lighting efficiency of the light emitting units are ranged from 70% to 100%.

12 Claims, 10 Drawing Sheets

(51) Int. Cl.
    *G02F 1/13357*    (2006.01)
    *H01L 33/44*      (2010.01)
    *G02F 1/1335*     (2006.01)

(56) References Cited

U.S. PATENT DOCUMENTS

| | | |
|---|---|---|
| 2004/0189189 A1 | 9/2004 | Burroughes |
| 2005/0104529 A1 | 5/2005 | Park |
| 2005/0263775 A1* | 12/2005 | Ikeda ................. H01L 51/5284 |
| | | 257/79 |
| 2011/0109228 A1 | 5/2011 | Shimomura |
| 2013/0026950 A1 | 1/2013 | Saes |
| 2013/0112960 A1* | 5/2013 | Chaji ................. H01L 51/5271 |
| | | 257/40 |
| 2014/0048825 A1 | 2/2014 | Hsieh |
| 2014/0347589 A1* | 11/2014 | Kim ................. G02F 1/136227 |
| | | 349/43 |
| 2015/0138174 A1 | 5/2015 | Yamauchi |
| 2015/0282265 A1 | 10/2015 | Wei |
| 2016/0114522 A1 | 4/2016 | Asakawa |
| 2016/0139443 A1* | 5/2016 | Zhang ................. H01L 29/7869 |
| | | 257/43 |
| 2016/0338161 A1 | 11/2016 | Song |
| 2017/0053602 A1 | 2/2017 | Chang |
| 2017/0125506 A1 | 5/2017 | Kim |
| 2018/0144716 A1* | 5/2018 | Jung ......................... G06T 7/90 |
| 2018/0226030 A1 | 8/2018 | Kurita |
| 2019/0067255 A1 | 2/2019 | Lim |
| 2019/0335553 A1 | 10/2019 | Ahmed |

* cited by examiner

ELECTRONIC DEVICE WITH LIGHT EMITTING UNITS WITH REDUCED POWER CONSUMPTION

CROSS REFERENCE TO RELATED APPLICATION

This application claims the benefit of U.S. Provisional Application Ser. No. 62/717,000, filed Aug. 10, 2018, the entire content of which is incorporated herein by reference.

BACKGROUND OF THE DISCLOSURE

1. Field of the Disclosure

The present disclosure relates to an electronic device, especially to an electronic device with a plurality of light emitting units.

2. Description of the Prior Art

Because light-emitting diodes have advantages like small volume, high efficiency, low power consumption, long lifetime, fast switching, high color rendering and containing no mercury which is harmful to the environment, it is widely used in lighting systems and display devices in our daily life. Lighting efficiency of normal light-emitting diodes would be different under different operating current. In applications of the present display devices, for reducing the cost, light-emitting diodes would be designed to be operated at a higher current to generate greater light emitting luminance of a single light-emitting diode and to gain the best luminance under the cost with fewer light-emitting diodes. However, when the light-emitting diodes controlled by the active elements are applied as the backlight of the liquid crystal display devices, more light-emitting diodes are operated at higher current, thereby causing energy waste of driving the light-emitting diodes.

SUMMARY OF THE DISCLOSURE

According to an embodiment, the present disclosure provides an electronic device including driving circuit substrate and a plurality of light emitting units. The driving circuit substrate includes a plurality of active elements, the light emitting units are disposed on the driving circuit substrate, wherein each of the light emitting units is electrically connected to the corresponding active element, wherein one of the active elements provides a first current to the corresponding light emitting element, such that the lighting efficiency of the light emitting units is ranged from 70% to 100%.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are for illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "include", "comprise" and "have" are used in an open-ended fashion, and thus should be interpreted to mean "include, but not limited to . . . ". It will also be understood that when an element is referred to as being "couple to" another element (or other variant), it can be directly connected to the other element or indirectly connected (for example, electrically connected) to the other element through one or more elements.

It should be noted that the technical features in different embodiments described in the following can be replaced, recombined, or mixed with one another to constitute another embodiment without departing from the spirit of the present disclosure.

Figure 1:
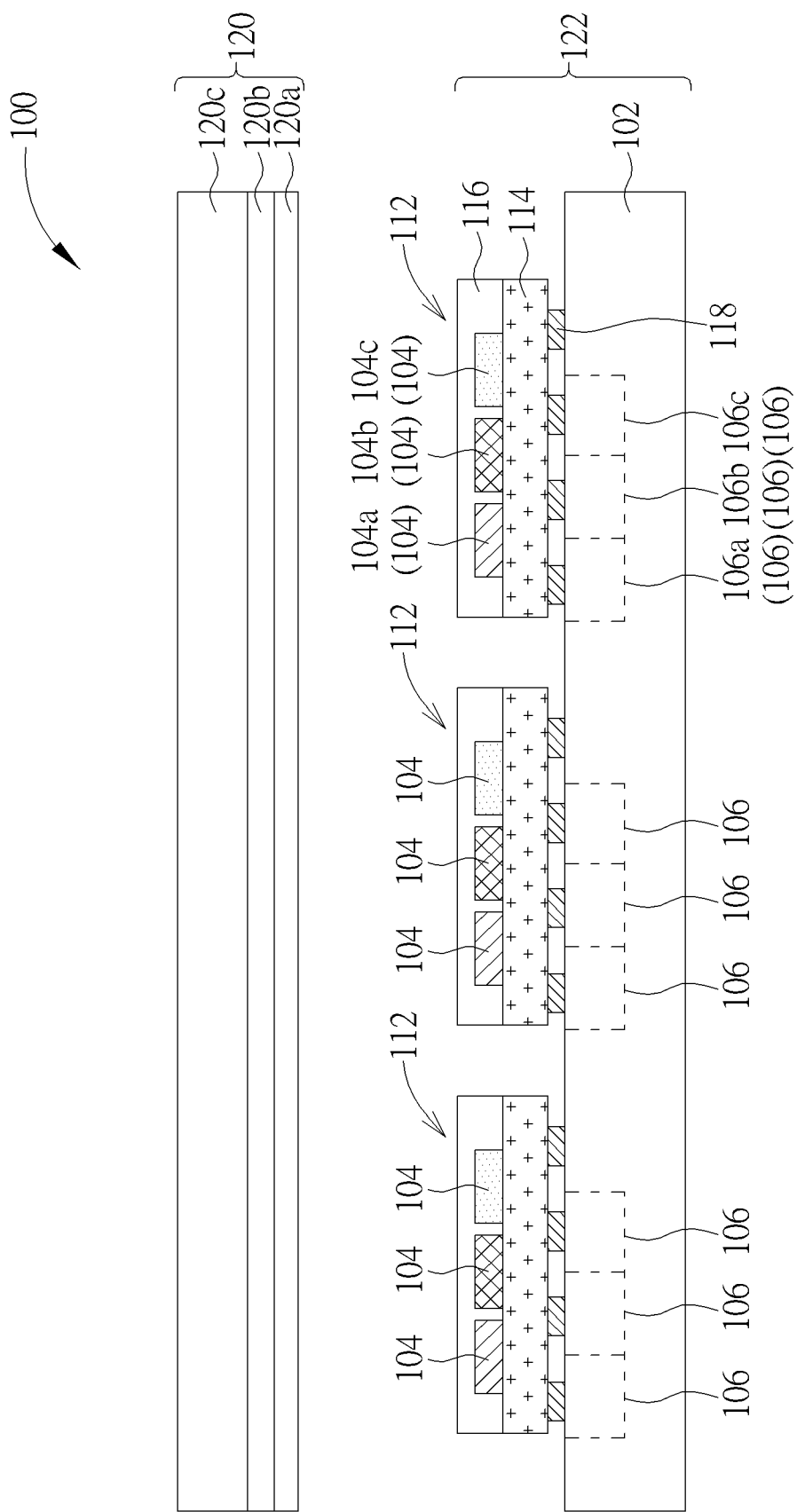
FIG. 1 schematically illustrates a cross-sectional view of an electronic device according to a first embodiment of the present disclosure.

Refer to FIG. 1, which schematically illustrates a cross-sectional view of an electronic device according to a first embodiment of the present disclosure. The electronic device 100 includes a driving circuit substrate 102 and a plurality of light emitting units 104, wherein the light emitting units 104 are disposed on the driving circuit substrate 102. The driving circuit substrate 102 includes a plurality of active elements 106 which are electrically connected to the corresponding light emitting units 104 for providing currents to the corresponding light emitting units 104, such that the light emitting units 104 generate the corresponding light.

Figure 2:
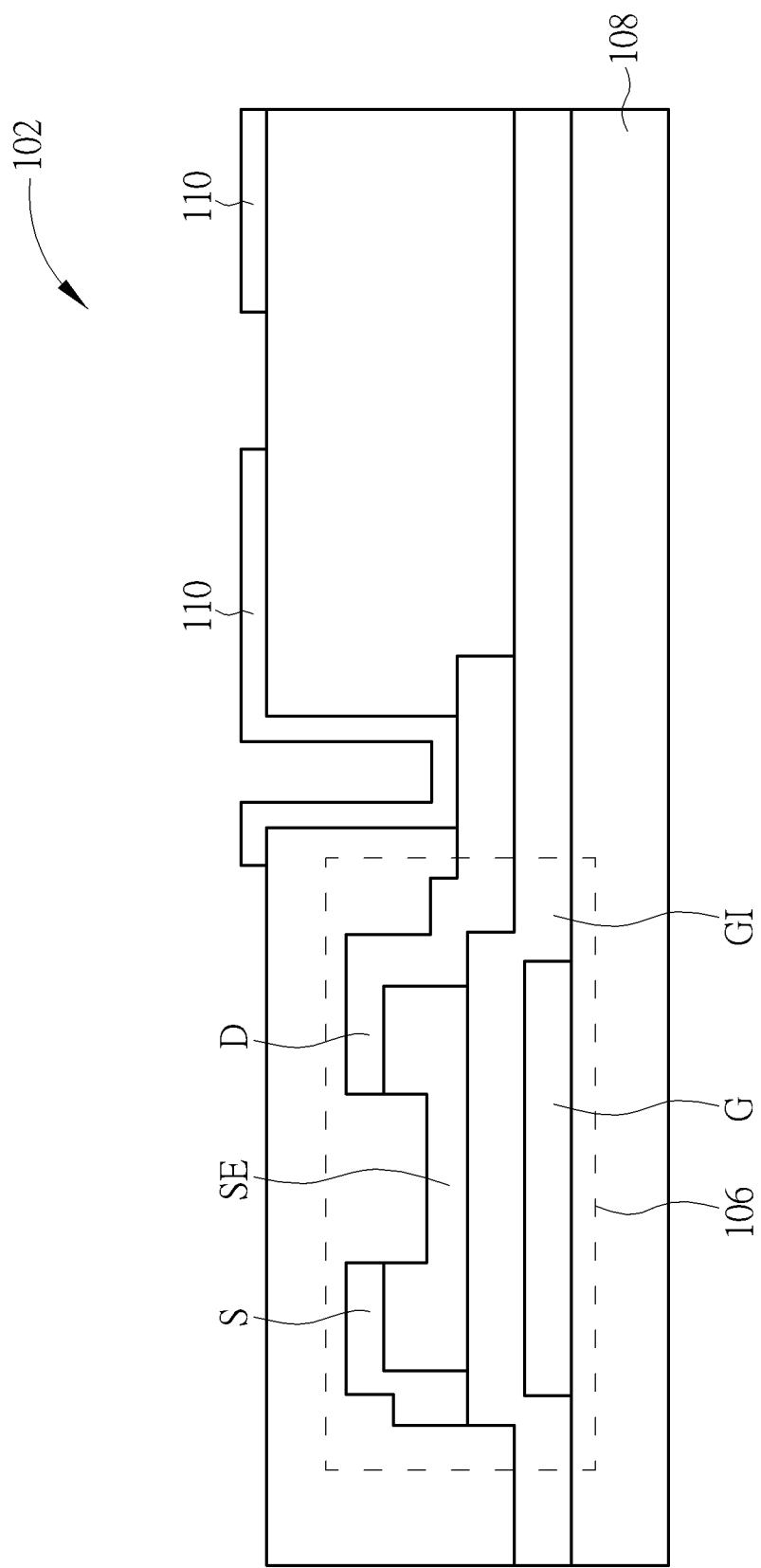
FIG. 2 schematically illustrates a cross-sectional view of a driving circuit substrate according to an embodiment of the present disclosure.

FIG. 2 schematically illustrates a cross-sectional view of a driving circuit substrate according to an embodiment of the present disclosure. Specifically, the driving circuit substrate 102 may further includes a substrate 108, and the active elements 106 are formed on the substrate 108. For example, the substrate 108 may include flexible substrate materials or rigid substrate materials, for example, polyimide (PI), polyethylene terephthalate (PET), polycarbonate (PC), polyethersulfone (PES), polybutylene terephthalate (PBT), poly(ethylene naphthalate) (PEN), polyarylate (PAR), acrylic, glass, quartz, sapphire, other suitable materials or combination of the above-mentioned materials, but not limited thereto.

As shown in FIG. 2, the driving circuit substrate 102 of this embodiment may for example be a thin film transistor substrate, and the active element 106 may for example include thin film transistor. For example, each of the light emitting units 104 is provided with currents by the corresponding thin film transistor. In some embodiments, thin film transistors may be arranged in an array on the substrate and are electrically connected to driving elements or control elements by wires, for example, electrically connected to a plurality of power wires by a plurality of data lines and a plurality of scan lines, but not limited thereto. In some embodiments, at least one of the active elements 106 may include at least one thin film transistor. For example, the at least one of the active elements 106 may include a switch thin film transistor and a driving thin film transistor, wherein the switch thin film transistor is used to switch on and off statuses of the driving thin film transistor, the driving thin film transistor electrically connects the power wire to the corresponding light emitting unit for providing currents to the corresponding light emitting unit, but the present disclosure is not limited thereto. In some embodiments, the driving circuit substrate 102 may include two electrodes 110 disposed on its surface and used for being electrically connected to one of the light emitting units 104, wherein one of the electrodes 110 may be electrically connected to the corresponding thin film transistor, and the other one of the electrodes 110 may be electrically connected to a common voltage source or be grounded. In some embodiments, the thin film transistors may include gate electrode G, gate insulting layer GI, semiconductor layer SE, source electrode S and drain electrode D. The thin film transistor of the present disclosure is not limited to the drawing shown in FIG. 2 and may also be another kind of thin film transistor.

As shown in FIG. 1, in some embodiments, one of the light emitting units 104 may for example be a light emitting diode, but not limited thereto. In some embodiments, the light emitting diode may for example be a mini light emitting diode (mini LED) chip, micro light emitting diode (micro LED) chip, organic light emitting diode (OLED), quantum dot light emitting diode (QLED), other kinds of light emitting diode or combination of the above-mentioned, but not limited thereto. Light emitting diode may for example be single surface (top surface) light emitting type, four surfaces (four side surfaces) light emitting type or five surfaces (top surface and four side surfaces) light emitting type.

As shown in FIG. 1, in some embodiments, the electronic device 100 may include a plurality of packages 112, and at least one of the light emitting units 104 is disposed in a corresponding one of the packages 112. Each of the packages 112 includes a carrier substrate 114 and an encapsulation layer 116, wherein the light emitting units 104 are disposed on the carrier substrate 114, and the encapsulation layer 116 is used for sealing the light emitting units 104 on the carrier substrate 114. For example, at least three of the light emitting units 104, such as a first light emitting unit 104a, a second light emitting unit 104b and a third light emitting unit 104c, may be disposed in each of the packages 112, and the first light emitting unit 104a, the second light emitting unit 104b and the third light emitting unit 104c are used for generating three different colors of light capable of being mixed into a white light, for example, may respectively include red light emitting diode, green light emitting diode and blue light emitting diode, but not limited thereto. Under such condition, each of the packages 112 may include a plurality of pins 118, wherein the pins 118 are electrically connected to the active elements 106 respectively, so each of the active elements 106 may individually provide a current to the corresponding light emitting unit 104, and one of the pins 118 is regarded as a common cathode/common anode pin of the first light emitting unit 104a, second light emitting unit 104b and third light emitting unit 104c. For example, the active elements 106 may include a first active element 106a, a second active element 106b and a third active element 106c providing corresponding currents to the first light emitting unit 104a, the second light emitting unit 104b and the third light emitting unit 104c respectively. In some embodiments, the encapsulation layer 116 may for example include epoxy resin or silicone. In some embodiments, the carrier substrate 114 may for example be a metal lead frame. In some embodiments, the carrier substrate 114 may also for example be a semiconductor substrate, and the carrier substrate 114 may include an electrostatic discharge protection device or a driving circuit for increasing driving efficiency or having extra functions. In some embodiments, electrostatic discharge protection device may for example be a Zener diode. In some embodiments, the semiconductor substrate may for example include silicon wafer, gallium arsenide, indium gallium arsenide, indium phosphide, gallium nitride or silicon carbide, but not limited thereto.

Figure 3:
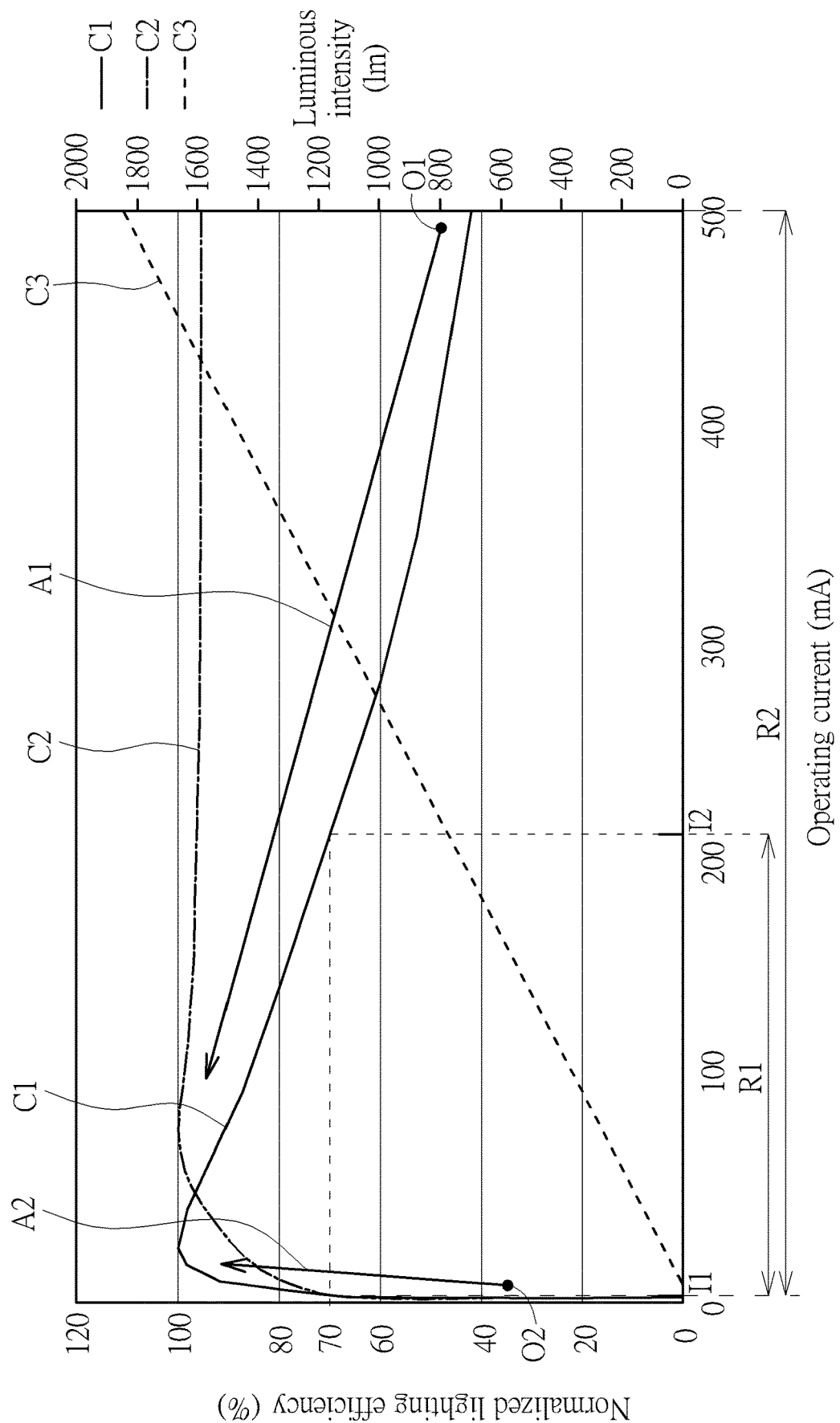
FIG. 3 schematically illustrates a relation between lighting efficiency of the light emitting unit generating different colors of light and the operating current and a relation between the operating current of the light emitting unit and the luminous intensity.

Refer to FIG. 3 and FIG. 1 together. FIG. 3 schematically illustrates relations between lighting efficiencies and the operating currents of the light emitting units generating different colors of light and a relation between the operating current and the luminous intensity of the light emitting units, wherein the curve C1 represents the relation between lighting efficiency and the operating current of one of the light emitting units 104 generating one color of light, the curve C2 represents the relation between lighting efficiency and the operating current of another one of the light emitting units 104 generating another color of light, the curve C3 represents the relation between the operating current and the luminous intensity of the light emitting units 104. For example, the curve C1 represents the relation between the lighting efficiency and the operating current of a blue light-emitting diode (the third light emitting unit 104c), the curve C2 represents the relation between the lighting efficiency and the operating current of a red light-emitting diode (the first light emitting unit 104a). In some embodiments, the curve C1 may also represent the relation between the lighting efficiency and the operating current of a green light-emitting diode (the second light emitting unit 104b). In FIG. 3, lighting efficiency of the light emitting unit 104 is a normalized value, that is, the peak value of the lighting efficiency is divided by itself and normalized to 1. In this embodiment, for one of the light emitting units 104 (the second light emitting unit 104b or the third light emitting unit 104c) in the curve C1, one of the active elements 106 provides a current to the corresponding light emitting unit 104, such that the operating current (that is, the current provided by the active element 106) of the corresponding light emitting unit 104 is located in a range R1, and the lighting efficiency of the corresponding light emitting unit 104 may be ranged from 70% to 100%. For example, range R1 may start from a first current value I1 to a second current value I2. For another one of the light emitting units 104 (the first light emitting unit 104a) in the curve C2, another one of the active elements 106 provides another current to the corresponding light emitting unit 104, such that the operating current (that is, another current provided by the another active element 106) of the light emitting unit 104 is located in another range R2, and the lighting efficiency of the light emitting unit 104 may be ranged from 70% to 100%. For example, the range R2 may be greater than the first current value I1. In some embodiments, the operating current (that is, the current provided by the active element 106 to the first light emitting units 104a) of the first light emitting units 104a may be different from the operating current (that is, the current provided by another one of the active elements 106 to the second light emitting units 104b) of the second light emitting units 104b or the operating current (that is, the current provided by further one of the active elements 106 to the third light emitting units 104c) of the third light emitting units 104c.

In this embodiment, the current provided by each of the active elements 106 to the corresponding light emitting unit 104 is located in the range R1 or the range R2, such that the lighting efficiency of the corresponding light emitting unit 104 is ranged from 70% to 100%, thereby lowering power consumption of the corresponding light emitting unit 104. For example, the current provided by the active elements 106 to the first light emitting units 104a may be located in the range R2, the current provided by the active elements 106 to the second light emitting units 104b and the third light emitting units 104c may be located in the range R1. In the embodiment shown in FIG. 1, the electronic device 100 may for example be a display device and includes a non-self-emissive panel 120 and a backlight module 122. Besides, the driving circuit substrate 102 and the light emitting units 104 of this embodiment may be included in the backlight module 122 as the elements for generating backlight, but the present disclosure is not limited thereto. The non-self-emissive panel 120 is disposed on the light emitting units 104. In some embodiments, the non-self-emissive panel 120 may be a liquid crystal display panel, but not limited thereto. For example, the liquid crystal display panel may include diffuser plate 120a, brightness enhancement film 120b, lower polarizer, liquid crystal panel 120c (including array substrate, liquid crystal layer and color filter layer) and upper polarizer, but not limited thereto. In some embodiments, the backlight module 122 may for example be a direct-lit backlight module, and the light emitting units 104 are disposed directly under the non-self-emissive panel 120. In some embodiments, the electronic device 100 may for example be a sensing device or an antenna.

It is noted that when the light emitting units 104 are applied in the backlight module 122, light emitting units 104 are continuously bright during the displaying of the display device, that is, light is continuously generated. In a light emitting diode of prior art backlight module, in order to reach the required luminance of backlight (that is, the luminous intensity shown in FIG. 3), the operating current of the light emitting diode is increased to a value corresponding to a lighting efficiency lower than 70% (for example, a current value corresponding to a starting point O1 of the arrow A1 shown in FIG. 3). However, in this embodiment, by lowering the operating current of the light emitting units 104 (the direction of the arrow A1 shown in FIG. 3) to be in the range corresponding to a lighting efficiency ranged from 70% to 100%, power consumption of the light emitting units 104 may be decreased. For example, operating current of each of the light emitting units 104 in this embodiment may be located in right side of the peak value of the curve C1 (or right side of the peak value of the curve C2) and in the range corresponding to a lighting efficiency ranged from 70% to 100%. Although luminous intensity of a single light emitting unit 104 is decreased (the curve C3 shown in FIG. 3) the number of the light emitting units 104 of the electronic device 100 in this embodiment may be increased and greater than the number of the prior art light emitting diodes, such that the luminance generated by all of the light emitting units 104 may reach the required luminance of backlight. For example, the number of the light emitting units 104 in a region with one inch diagonal is greater than or equal to 10. That is, in a five-inch display device, the number of the light emitting units 104 may be greater than or equal to 50, or in a sixty five-inch display device, the number of the light emitting units 104 may be greater than or equal to 650. Besides, the light emitting units 104 of the electronic device 100 in this embodiment may be individually controlled to emit light or not emit light by the corresponding active element 106. Thus, the electronic device 100 of this embodiment may lower power consumption of driving the light emitting units 104 or increase contrast when displaying.

Figure 4:
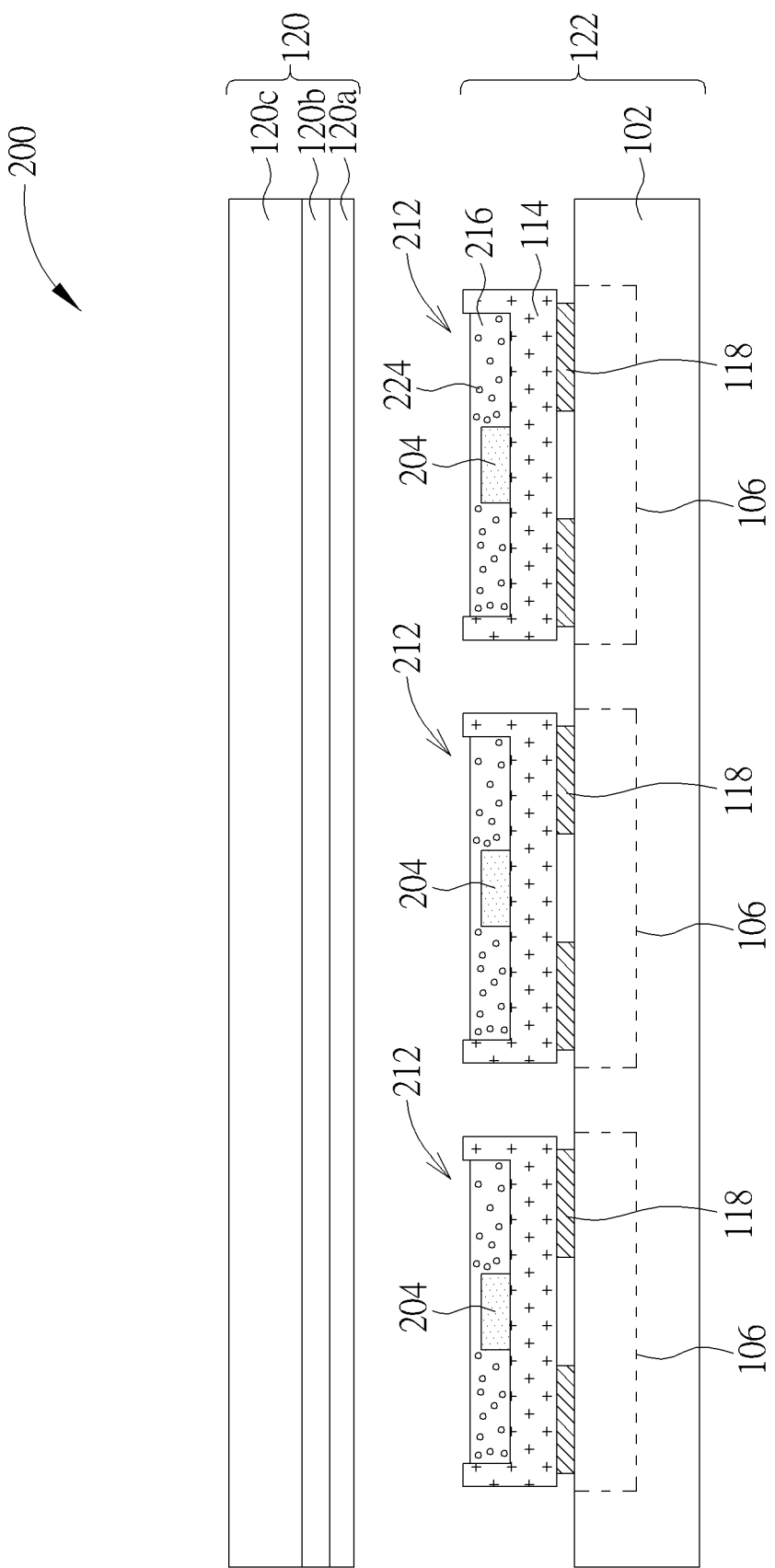
FIG. 4 schematically illustrates a cross-sectional view of an electronic device according to a variant embodiment of the first embodiment of the present disclosure.

FIG. 4 schematically illustrates a cross-sectional view of an electronic device according to a variant embodiment of the first embodiment of the present disclosure. In the display device 200 of this variant embodiment, one of the light emitting units 204 disposed in each of the packages 212 may generate a first color light. For example, the light emitting unit 204 may include at least one light emitting diode, in other words, a single light emitting diode may be disposed in each of the packages 212, or a plurality of light emitting diodes generating the same first color light may be disposed in each of the packages 212. Besides, an encapsulation layer 216 may include a plurality of light converting particles for converting the first color light into a second color light. For example, one of the light emitting units 204 may for example include a blue light emitting diode, and the light converting particles 224 may for example include the material capable of converting a blue light into a white light or a light with other colors, such as fluorescent material, phosphorescent material and quantum dot material, but not limited thereto. Under such condition, each of the packages 212 may include two pins 118, one of the pins 118 is electrically connected to an active element 106, and the other one of the pins 118 is regarded as common cathode/common anode pin. In some embodiments, the carrier substrate 114 may for example be a metal lead frame. In some embodiments, the carrier substrate 114 may also for example be a semiconductor substrate, and the substrate may include an electrostatic discharge protection device or a driving circuit for increasing driving efficiency or having extra functions. In some embodiments, electrostatic discharge protection device may for example be a Zener diode. In some embodiments, the semiconductor substrate may for example include silicon wafer, gallium arsenide, indium gallium arsenide, indium phosphide, gallium nitride or silicon carbide, but not limited thereto.

The electronic device of the present disclosure is not limited to the above-mentioned embodiment and may have different variant embodiments or other embodiments. To simplify the description, the same component in other embodiments would be labeled with the same symbol in the first embodiment. To compare the dissimilarities among the first embodiment and other embodiments conveniently, the following description will detail the dissimilarities among the first embodiment and other embodiments and the identical features will not be redundantly described.

Figure 5:
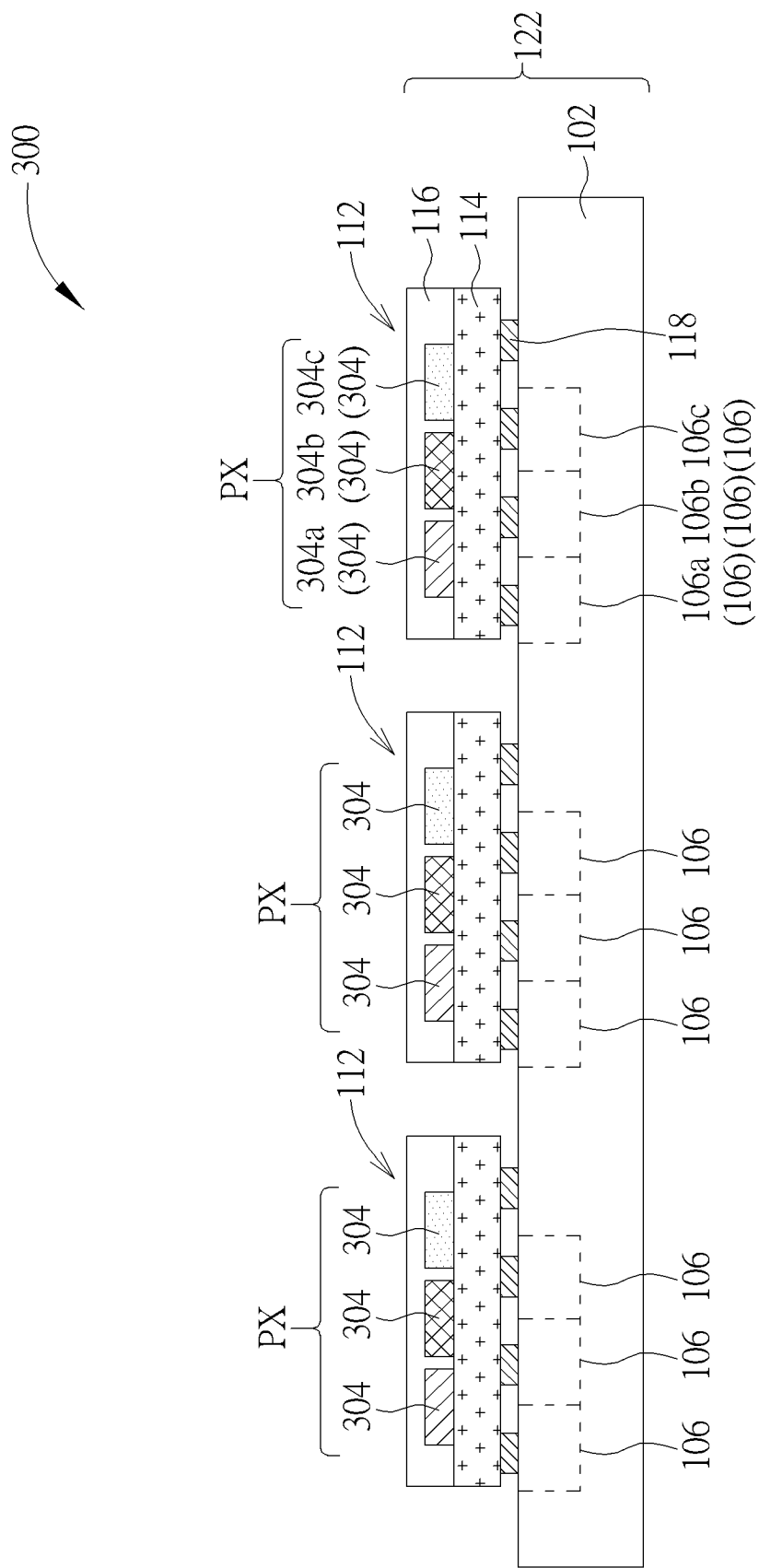
FIG. 5 schematically illustrates a cross-sectional view of an electronic device according to a second embodiment of the present disclosure.

Refer to FIG. 5, which schematically illustrates a cross-sectional view of an electronic device according to a second embodiment of the present disclosure. In the electronic device 300 of this embodiment, the electronic device 300 may for example be a display device, and the light emitting units 304 may be regarded as display units, such as pixels or sub pixels, but not limited thereto. In this embodiment, light emitting units 304 may form a plurality of pixels PX, each of the pixels PX includes at least three of the lighting units 304. In some embodiments, the electronic device 300 may for example be a sensing device or an antenna. Compared to the embodiment shown in FIG. 1 and FIG. 3, the electronic device 300 of this embodiment may include self-emissive panel. In this embodiment, the light emitting units 304 may include a plurality of first light emitting units 304a, a plurality of second light emitting units 304b and a plurality of third light emitting units 304c, each of the first light emitting units 304a, each of the second light emitting units 304b and each of the third light emitting units 304c are used for generating three different colors of light capable of being mixed into a white light and are regarded as sub pixels for different colors. For example, the current provided by the first active element 106a to the first light emitting unit 304a may be located in the range R2, the current provided by the second active element 106b to the second light emitting unit 304b and the current provided by the third active element 106c to the third light emitting unit 304c may be located in the range R1, such that lighting efficiency of each of the light emitting units 304 may be ranged from 70% to 100%, thereby lowering power consumption of the light emitting units 304.

Figure 6:
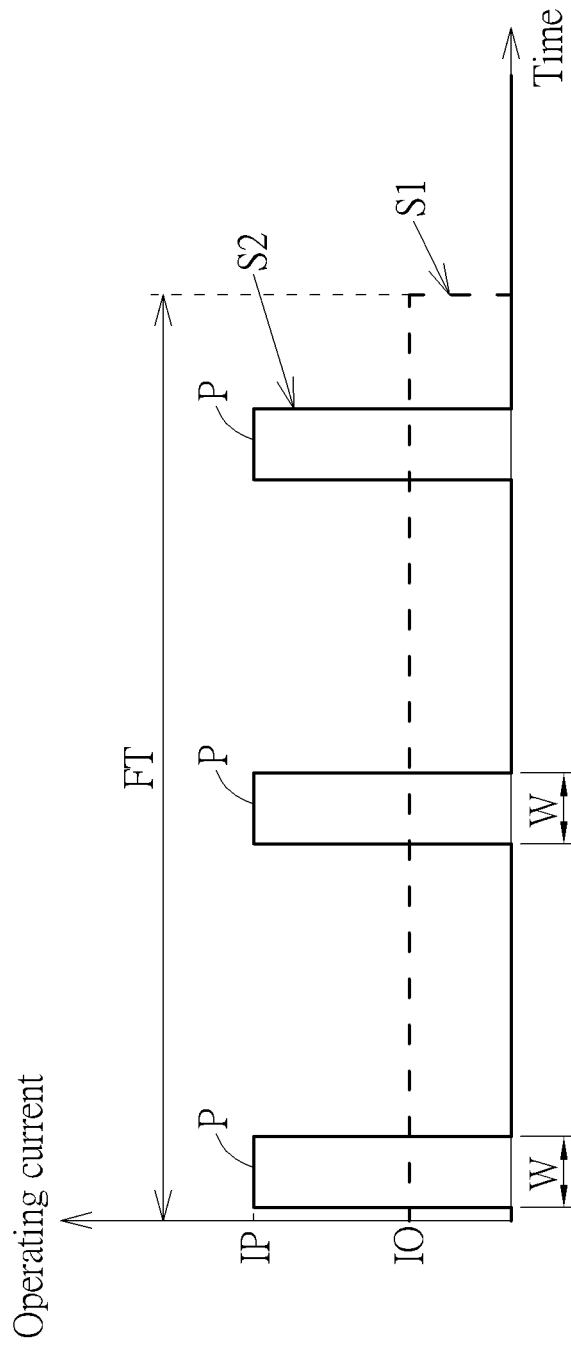
FIG. 6 schematically illustrates a timing of the operating current of the light emitting unit according to a second embodiment of the present disclosure.

Refer to FIG. 6 as well as FIG. 3 and FIG. 5. FIG. 6 schematically illustrates a timing of the operating current of the light emitting unit according to a second embodiment of the present disclosure, wherein a first signal S1 represents the operating current provided to one of the light emitting units which is regarded as one of the sub pixels of a prior art display device, a second signal S2 represents the operating current provided to one of the light emitting units 304 which is regarded as one of the sub pixels of the electronic device 300 of the second embodiment. It is noted that when the light emitting units 304 are regarded as sub pixels, the light emitting units 304 are not continuously bright during displaying of the display device and still need to show the luminance of gray level of the sub pixels. In the prior art light emitting units which are regarded as sub pixels, in order to show different gray levels, the operating current provided to the light emitting units is lower than the current value IO which correspond to the lighting efficiency lower than 70% (for example, the current value corresponding to the starting point O2 in the arrow A2 shown in FIG. 3), and as the first signal S1 shown in FIG. 6, in a single frame time FT, the light emitting units are continuously provided with this operating current IO, such that lighting efficiency of the light emitting units are poor. However, in this embodiment, the operating current provided to the light emitting units 304 may be increased and greater than or equal to the current value IP which correspond to a lighting efficiency larger than or equal to 70% (the direction of the arrow A2 shown in FIG. 3), thereby increasing lighting efficiency of the light emitting units 304. For example, the operating current of each of the light emitting units 304 in this embodiment may be located in left side of the peak value of the curve C1 (or left side of the peak value of the curve C2) and in the range which corresponds to the lighting efficiency ranged from 70% to 100%. In order to avoid over high luminance caused by increasing the current value, the current provided by the active element 106 to the light emitting unit 304 in the single frame time FT is not a fixed value in this embodiment, but includes a plurality of pulse current P spaced apart from each other, as shown in second signal S2 in FIG. 6, the current value IP of each of the pulse currents P is located in the range of the operating current in the light emitting unit 304 which correspond to the lighting efficiency ranged from 70% to 100% (the range R1 of the curve C1 or the range R2 of the curve C2 shown in FIG. 3). By adjusting the time width W of each of the pulse currents P, the luminance of one the light emitting units 304 in the single frame time FT meets the required luminance. For example, when a gray level with higher luminance is required, time width W of each of the pulse currents P may be increased; and when a gray level with lower luminance is required, time width W of each of the pulse currents P may be decreased. In some embodiments, time width W of different pulse currents P may be different.

Figure 7:
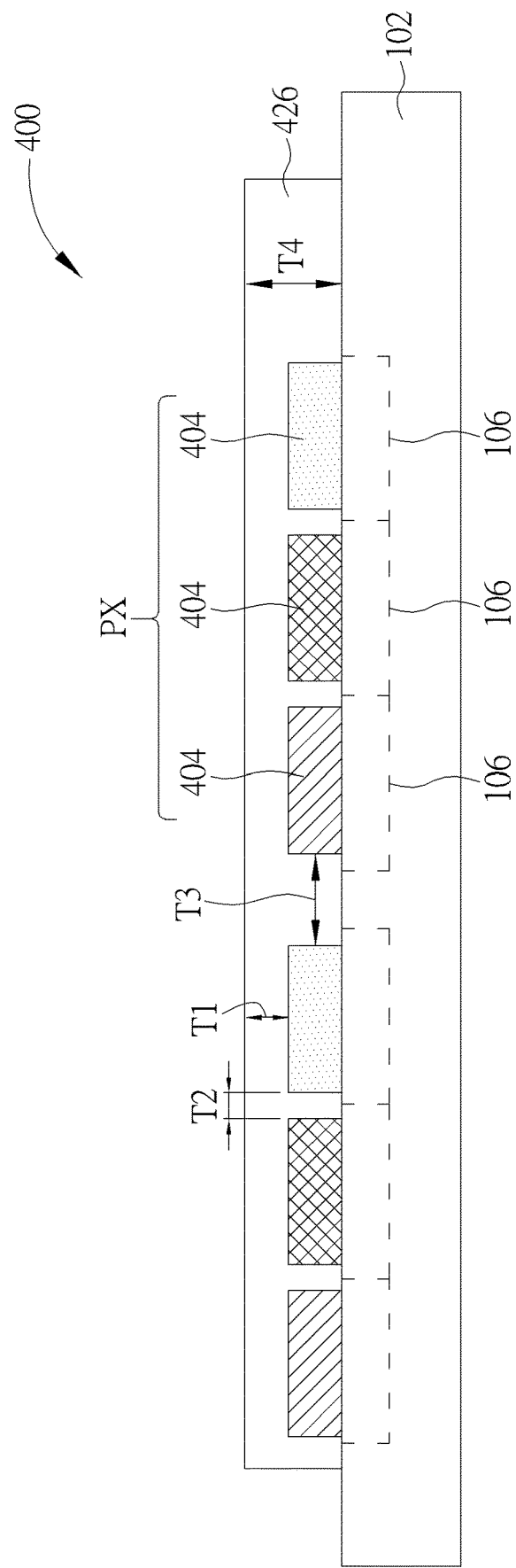
FIG. 7 schematically illustrates a cross-sectional view of an electronic device according to a first variant embodiment of the second embodiment of the present disclosure.

FIG. 7 schematically illustrates a cross-sectional view of an electronic device according to a first variant embodiment of the second embodiment of the present disclosure. As shown in FIG. 7, the difference between the electronic device 400 provided by this variant embodiment and the electronic device 300 shown in FIG. 5 is that the light emitting units 404 are directly disposed on the driving circuit substrate 102. In some embodiments, the electronic device 400 may further include a first passivation layer 426 covering the light emitting units 404 and the driving circuit substrate 102 for protecting the light emitting units 404. Because the first passivation layer 426 directly covers the light output surface of the light emitting units 404, for lowering the influence of the first passivation layer 426 to the luminance of output light of the light emitting units 404, the first passivation layer 426 with 1 micrometer thickness has a transmittance greater than or equal to 63%, or the first passivation layer 426 with 1 micrometer thickness has an optical density (OD) less than or equal to 0.2. For example, thickness T1 of the first passivation layer 426 directly on one of the light emitting units 404 may be ranged from 1 micrometer to 5 micrometers.

In some embodiments, in addition to the function of protecting the light emitting units 404, the first passivation layer 426 may also have the function of lowering visibility of the light emitting units 404. For example, the first passivation layer 426 with 1 micrometer thickness further has a transmittance less than or equal to 98%. In some embodiments, the first passivation layer 426 may for example include photoresist material, silicone or epoxy resin. In some embodiments, the first passivation layer 426 may further include light absorbing material, light scattering particles or combinations thereof. The light absorbing material may for example include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), antimony trioxide ($Sb_2O_3$), silicon oxide ($SiO_2$) or combinations thereof, but not limited thereto. The light scattering particle may for example include Au, Ag, Cu, Pt, Fe, Co, Ni, Mn or combinations thereof, but not limited thereto.

In some embodiments, in order to increase light mixing of adjacent two of the light emitting units 404 in the same pixel PX or decrease light mixing of adjacent two of pixels PX, a space T3 between adjacent two of the pixels PX may be greater than a space T2 between adjacent two of the light emitting units 404 in the same pixel PX. In some embodiments, the thickness T1 of the first passivation layer 426 directly on one of the light emitting units 404 may be less than or equal to the space T2 between adjacent two of the light emitting units 404 in the same pixel PX. In some embodiments, the space T3 between adjacent two of the pixels PX may be larger than the thickness T1 of the first passivation layer 426 directly on one of the light emitting units 404. For example, the space T2 may be ranged from 3 micrometers to 20 micrometers, and the space T3 may larger than about 20 micrometers.

In this embodiment, the first passivation layer 426 may further cover a part of the driving circuit substrate 102. In order to cover the wires (for example the metal wires) in the driving circuit substrate 102, the first passivation layer 426 directly on the part of the driving circuit substrate 102 without light emitting units 404 disposed thereon may have a thickness T4. For example, when one of the light emitting units 404 is a micro light emitting diode, thickness T4 may be ranged from 4 micrometers to 15 micrometers. When one of the light emitting units 404 is a mini light emitting diode, thickness T4 may be ranged from 50 micrometers to 150 micrometers. In some embodiments, thickness T4 may be larger than thickness T1. In some embodiments, the electronic device 400 may further include a second passivation layer (the second passivation layer shown in FIG. 9) covering a part of the driving circuit substrate 102 without light emitting units 404 disposed thereon, and transmittance of the second passivation layer may be different from transmittance of the first passivation layer 426.

Figure 8:
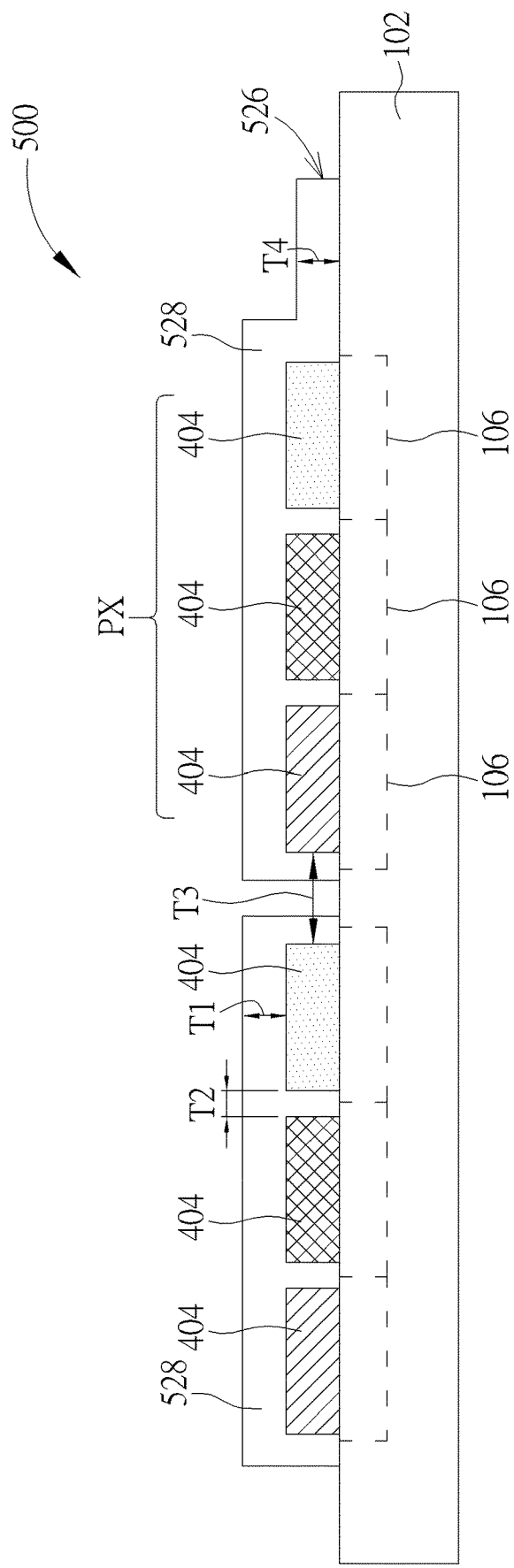
FIG. 8 schematically illustrates a cross-sectional view of an electronic device according to a second variant embodiment of the second embodiment of the present disclosure.

FIG. 8 schematically illustrates a cross-sectional view of an electronic device according to a second variant embodiment of the second embodiment of the present disclosure. As shown in FIG. 8, the difference between the electronic device 500 of this variant embodiment and the electronic device 400 shown in FIG. 7 is that the first passivation layer 526 includes a plurality of protecting blocks 528 spaced apart from each other, and each of the protecting blocks 528 covers all of the light emitting units 404 in the corresponding one of the pixels PX. Because the protecting blocks 528 covering different pixels PX are spaced apart from each other, when the electronic device 500 is folded, cracks would not be easily generated. In some embodiments, the electronic device 500 may further include a second passivation layer (the second passivation layer shown in FIG. 9) covering a part of the driving circuit substrate 102 without light emitting units 404, and transmittance of the second passivation layer may be different from transmittance of the first passivation layer 526.

Figure 9:
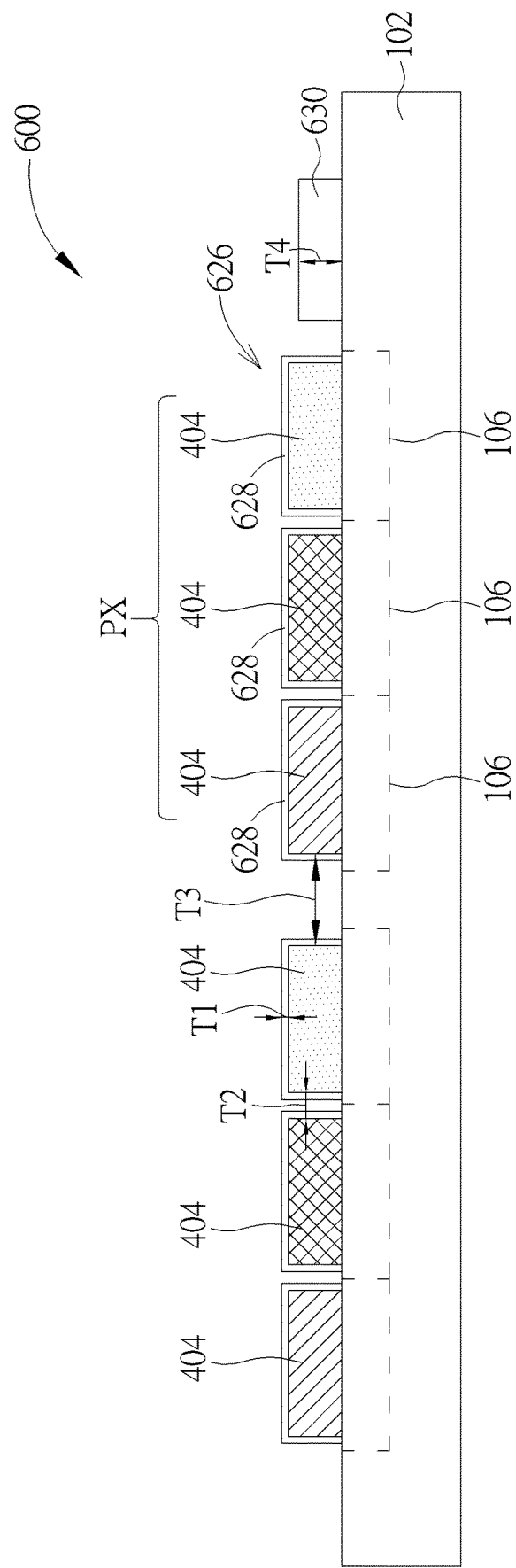
FIG. 9 schematically illustrates a cross-sectional view of an electronic device according to a third variant embodiment of the second embodiment of the present disclosure.

FIG. 9 schematically illustrates a cross-sectional view of an electronic device according to a third variant embodiment of the second embodiment of the present disclosure. As shown in FIG. 9, the difference between the electronic device 600 of this variant embodiment and the electronic device 400 shown in FIG. 7 is that the first passivation layer 626 includes a plurality of protecting blocks 628 spaced apart from each other, each of the protecting blocks 628 covers one of the light emitting units 404. Because the protecting blocks 628 covering different light emitting units 404 are spaced apart from each other, when the electronic device 600 is folded, cracks would not be easily generated. In some embodiments, the electronic device 600 may further include a second passivation layer 630 disposed on a part of the driving circuit substrate 102 without light emitting units 404 disposed thereon, and transmittance of the second passivation layer 630 may be different from transmittance of the first passivation layer 626, such that the disposition of the second passivation layer 630 may adjust visibility of the wires (for example the metal wires) in the driving circuit substrate 102, thereby lowering visibility of the driving circuit substrate 102.

Figure 10:
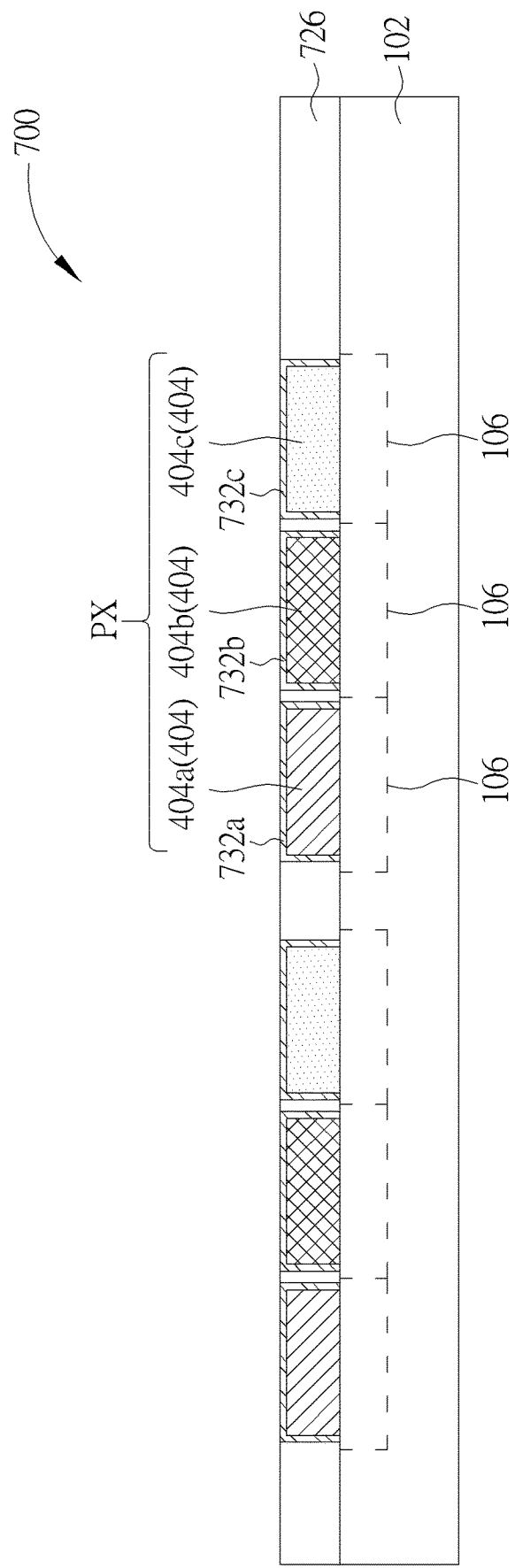
FIG. 10 schematically illustrates a cross-sectional view of an electronic device according to a fourth variant embodiment of the second embodiment of the present disclosure.

FIG. 10 schematically illustrates a cross-sectional view of an electronic device according to a fourth variant embodiment of the second embodiment of the present disclosure. As shown in FIG. 10, the difference between the electronic device 700 of this variant embodiment and the electronic device 400 shown in FIG. 7 is that the electronic device may further include a plurality of third passivation layers 732a, 732b and 732c covering the corresponding light emitting elements 404a, 404b and 404c respectively. Transmittances of the third passivation layer 732a, 732b and 732c may correspond to the covered light emitting units 404a, 404b and 404c respectively, such that the light generated from the corresponding light emitting units 404a, 404b and 404c are allowed to penetrate through. For example, the light emitting unites 404a, 404b and 404c are used for generating different colors of light, wherein the third passivation layer 732a covers the light emitting unit 404a, and the light from light emitting unit 404a are allowed to penetrate through; the third passivation layer 732b covers the light emitting unit 404b, and the light from light emitting unit 404b are allowed to penetrate through; and the third passivation layer 732c covers the light emitting unit 404c, and the light from light emitting unit 404c are allowed to penetrate through. In some embodiments, the third passivation layer 732a, 732b and 732c may be a color filter formed by lithography process or inject process. Under such condition, the third passivation layer 732a, 732b and 732c may have a flat upper surface. In some embodiments, the first passivation layer 726 may not cover the third passivation layer 732a, 732b and 732c and the light emitting units 404, that is, an upper surface of the first passivation layer 726 may be coplanar with the upper surfaces of the third passivation layer 732a, 732b and 732c or lower than upper surfaces of the third passivation layer 732a, 732b and 732c. The material of the first passivation layer 726 may for example be the same as the first passivation layer shown in FIG. 7, which will not be redundantly described herein, but not limited thereto. In some embodiments, the first passivation layer 726 may also cover all the light emitting units 404 as shown in FIG. 7 or include the protecting blocks shown in FIG. 8 or FIG. 9. In some embodiments, the third passivation layer 732a, 732b and 732c may also include pigment or adhesive and is formed by mixing pigment with adhesive and a dispense process. Under such condition, upper surfaces of the third passivation layer 732a, 732b and 732c may be convex.

As mentioned above, in the electronic device of the present disclosure, power consumption of the light emitting units may be lowered by making the operating current of the light emitting units to be in a range which correspond to a lighting efficiency ranged from 70% to 100%, and by controlling emitting of the light emitting units through the active elements, contrast would be increased when the electronic device is displaying.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
   a driving circuit substrate comprising a plurality of active elements;
   a plurality of light emitting units disposed on the driving circuit substrate, wherein each of the light emitting units is electrically connected to a corresponding one of the active elements; and
   a first passivation layer covering the light emitting units, wherein the first passivation layer has a transmittance greater than or equal to 63%, and the first passivation layer has a thickness greater than 1 micrometer;
   wherein one of the active elements provides a first current to a corresponding one of the light emitting units, such that lighting efficiency of the corresponding one of the light emitting units is ranged from 70% to 100%.

2. The electronic device of claim 1, wherein the one of the active elements comprises a thin film transistor.

3. The electronic device of claim 1, wherein in a region with 1 inch diagonal, a number of the light emitting units is greater than or equal to 10.

4. The electronic device of claim 1, wherein the first current comprises a plurality of pulse currents spaced apart from each other, the one of the active elements provides a peak value of each of the pulse currents to the corresponding one of the light emitting units, such that the lighting efficiency of the corresponding one of the light emitting units is ranged from 70% to 100%.

5. The electronic device of claim 1, wherein the first passivation layer comprises a plurality of protecting blocks spaced apart from each other, and each of the protecting blocks covers one of the light emitting units respectively.

6. The electronic device of claim 1, further comprising a second passivation layer disposed on a part of the driving circuit substrate without the light emitting units, and a transmittance of the second passivation layer being different from the transmittance of the first passivation layer.

7. The electronic device of claim 1, wherein the first passivation layer comprises photoresist material, silicone or epoxy resin.

8. The electronic device of claim 1, wherein the light emitting units form a plurality of pixels, each of the pixels comprises at least three of the light emitting units.

9. The electronic device of claim 8, wherein the thickness of the first passivation layer directly on one of the light emitting units is less than or equal to a space between adjacent two of the light emitting units.

10. The electronic device of claim 8, wherein a space between adjacent two of the pixels is greater than the thickness of the first passivation layer directly on one of the light emitting units and is greater than a space between adjacent two of the light emitting units in a same one of the pixels.

11. The electronic device of claim 8, wherein the first passivation layer comprises a plurality of protecting blocks spaced apart from each other, and each of the protecting blocks covers the light emitting units of one of the pixels.

12. The electronic device of claim 1, wherein another one of the active elements provides a second current to another corresponding one of the light emitting units, such that lighting efficiency of the another corresponding one of the light emitting units is ranged from 70% to 100%, and the first current is different from the second current.

* * * * *